United States Patent [19]
Watanabe

[11] Patent Number: 4,602,355
[45] Date of Patent: Jul. 22, 1986

[54] MEMORY CIRCUIT WITH NOISE PREVENTING MEANS FOR WORD LINES

[75] Inventor: Hiroshi Watanabe, Tokyo, Japan

[73] Assignee: NEC Corporation, Tokyo, Japan

[21] Appl. No.: 531,372

[22] Filed: Sep. 12, 1983

[30] Foreign Application Priority Data

Sep. 10, 1982 [JP] Japan ............................... 57-157455

[51] Int. Cl.⁴ ............................................. G11C 7/02
[52] U.S. Cl. .................................... 365/206; 365/203
[58] Field of Search ................ 365/206, 207, 208, 203

[56] References Cited
U.S. PATENT DOCUMENTS 4,133,049  1/1979  Shirato ............................. 365/208
4,280,198  7/1981  Heuber et al. ..................... 365/203

*Primary Examiner*—Joseph A. Popek
*Attorney, Agent, or Firm*—Sughrue, Mion, Zinn, Macpeak & Seas

[57] ABSTRACT

A memory circuit provided with improved noise preventing circuits allowing a high-density arrangement of memory cells is disclosed. The memory circuit comprises a cross-coupled circuit provided for adjacent two word lines. The cross-coupled circuit suppress the potential of one of the adjacent two word lines to a reference level when the other of the adjacent two word lines takes a selection level or a level near the selection level.

11 Claims, 4 Drawing Figures

MEMORY CIRCUIT WITH NOISE PREVENTING MEANS FOR WORD LINES

BACKGROUND OF THE INVENTION

This invention relates generally to a memory circuit and more particularly, to a circuit for preventing an erroneous operation caused by noise applied to word lines.

Memory circuits generally comprises a plurality of word lines in a row direction, a plurality of bit lines in a column direction intersecting with the word lines, and a plurality of memory cells disposed at intersections of the word lines and the bit lines. When one of word lines is selected, the memory cells connected to the selected word line are in the selection state, and produce data from the respective selected cells to their corresponding bit lines at the time of reading and take data from the bit lines into the selected memory cells at the time of writing. In other words, electrical connections between the bit lines and the memory cells are controlled by the word lines. If word line or lines other than the selected word line are changed from non-selection level to a level near the selection level of the word line by noise or the like, the contents of two or more memory cells are produced simultaneously for one bit line so that accurate access to the data of the selected memory cell is no longer possible. Moreover, the contents of the celected memory cells are destroyed in the memory where the read-out data are rewritten into the selected memory cells from the bit lines. Particularly when a decoder circuit driving the word lines is of a dynamic type, the problem that the potentials of the non-selected word lines change due to noise or the like, becomes all the more remarkable. In other words, the dynamic type decoder circuit consists basically of a NOR gate to which a plurality of address input signals are applied, and a transmission transistor which receives the output of this NOR gate at its gate and transmits the word line driving pulse to the word line when the output of the NOR gate is true. Accordingly, the non-selected word lines are kept in the floating state without being connected to any of power sources and are likely to be affected by noise, thereby causing potential changes. In this point of view, a noise prevention circuit is added to each word line in order to prevent floating of the non-selected word lines. This noise prevention circuit includes a first field effect transistor which is connected between the word line and the reference potential and whose gate is connected to a pre-charge node, a second field effect transistor which is connected between the pre-charge node and the reference potential, and a third field effect transistor which charges the pre-charge node in a reset period. When the word line is in the non-selection state, this noise prevention circuit renders the first transistor conductive by the charge that is charged to the pre-charge node, and holds this word line at the reference potential. However, since the noise prevention circuit of the prior art described above necessitates the three field effect transistors and, this noise prevention circuit must be added to every word lines, it requires a relatively large chip area to form the noise prevention circuits for all the word lines. Accordingly, the pitch of arrangement between the word lines is restricted by the region in which each noise prevention circuit is formed, and hence, can not be reduced. This renders a critical problem in order to realize a high density memory circuit.

SUMMARY OF THE INVENTION

It is an object of the prevent invention to provide a memory circuit which is devoid of an erroneous operation due to noise and which has an increased density.

It is another object of the present invention to provide a memory circuit equipped with noise prevention circuits whose occupying area on a chip is reduced.

In the memory circuit in accordance with the present invention, adjacent two word lines which are associated to different word decoders, are provided with one noise prevention circuit. Each noise prevention circuit includes a first field effect transistor connected between one of the adjacent two word lines and a reference potential and having the gate thereof connected to the other of the adjacent two word lines and a second field effect transistor connected between the other of the adjacent two word lines and the reference potential and having the gate thereof connected to the one of the adjacent two word lines.

The present invention is based upon the conception that the main cause of the noise applied to non-selected word lines is an induced charge from the selected word line and the most of the induced charge are applied to the non-selected word lines adjacent to the selected word line.

Most of the noise occurring in the word lines of a dynamic memory using one-transistor type memory cells are affected by the noise from the adjacent word lines to some extents. This is partly because of the memory cell arrangement and partly because of the arrangement in which adjacent word lines are disposed on an electrode of a transistor made of polycrystalline silicon and which generates capacitance coupling. Therefore, when the selected word line is at a high level, it applies noise to the adjacent non-selected word lines. This noise is detrimental because it raises the non-selected word lines to the high level. Though the capacitance coupling takes place between the bit line and the word line, the noise applied from the bit line is not detrimental to the non-selected word lines because the bit line changes to a low level.

DESCRIPTION OF THE PREFERRED EMBODIMENTS

In the description which follows, N-channel MOSFETS are used as the field effect transistors, and a power source $V_{DD}$ level represents logic "1" while the ground potential represents the logic "0". However, the circuit construction will not be changed at all even when P-channel MOSFETs are used as the field effect transistors.

The prior art memory circuit will be explained initially with reference to FIG. 1.

Figure 1:
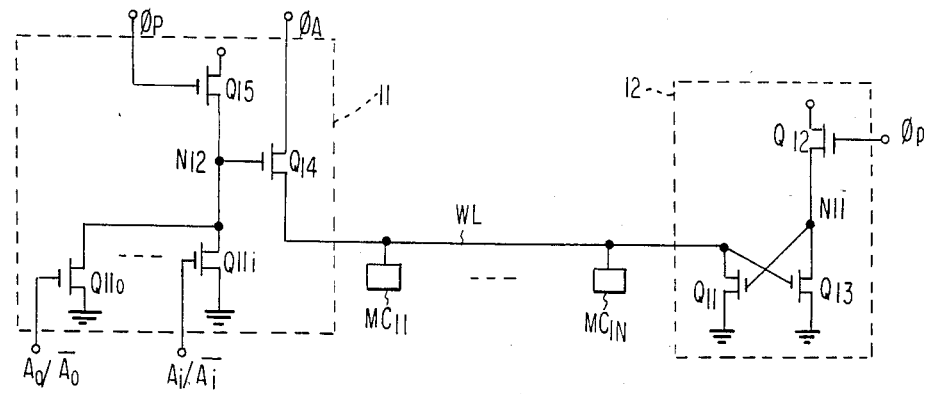
FIGS. 1 and 2 are circuit diagrams showing prior art circuits.

FIG. 1 illustrates one word line WL out of a plurality of word lines, memory cells $MC_{11}$ to $MC_{IN}$ connected to the word line WL, a word line noise prevention circuit 12 and a decoder circuit 11. A plurality of true and complementary address signals $A_0/\overline{A_0}$ through $A_i/\overline{A_i}$ are applied in a desired combination to the decoder circuit 11 in which these signals are applied to the gates of transistors $Q_{110}$ through $Q_{11i}$. When the memory circuit is in a reset period, all the true and complementary address signals $A_0/\overline{A_0}$ to $A_i/\overline{A_i}$ are at the "0" level and all the transistors $Q_{110}$ through $Q_{11i}$ are turned off, and a precharge signal $\phi_p$ is at the "1" level so that the node $N_{12}$ is at the "1" level by the transistor $Q_{15}$ and the transistor $Q_{14}$ is turned on.

At this time, a control signal $\phi_A$ is at the "0" level so that the word line WL is at the "0" level through the conducting transistor $Q_{14}$ and the memory cells $MC_{11}$ through $MC_{IN}$ hold their data. Since the transistor in $Q_{13}$ in the noise prevention circuit 12 is turned off and the node $N_{11}$ is set to the "1" level by the transistor $Q_{12}$ in response to the "1" level of the signal $\phi_p$.

When the memory is accessed, the pre-charge signal $\phi_p$ changes to the "0" level and either of the true and complementary address signals $A_0/\overline{A_0}$ through $A_i/\overline{A_i}$ change to the "1", level. When at least one of the signals applied to the transistors $Q_{110}$ through $Q_{11i}$ changes to the "1" level, the node $N_{12}$ is discharged and becomes the "0" level so that the transistor $Q_{14}$ is turned off. If all the inputs to the decoder 11 are at the "0" level, the node $N_{12}$ holds the "1" level and the transistor $Q_{14}$ is turned on, thereby determining the output state of the decoder 11, especially of the NOR gate.

Thereafter, the control signal $\phi_A$ becomes the "1" level and the level of the word line WL is decided in accordance with the ON/OFF state of the transistor $Q_{14}$. If the conductance of the transistor $Q_{14}$ is set in advance to a value greater than that of the transistor $Q_{11}$, the transistor $Q_{13}$ is turned on when the word line WL is selected and its potential becomes the high level, so that the node $N_{11}$ is discharged to turn off the transistor $Q_{11}$, thereby exerting no influence upon the high level of the word line WL.

On the other hand, when the word line WL is not selected, its level is at the "0" level and hence, the transistor $Q_{13}$ is turned off. Accordingly, the node $N_{11}$ is at the "1" level and the transistor $Q_{11}$ is turned on and attempts to hold the word line WL at the ground level. Even if the noise enters the word line WL under the non-selection state, therefore, the noise is discharged by the transistor $Q_{11}$ to the ground potential.

Since this circuit 12 must be added to each word line in the conventional memory circuit, the circuit 12 is not suitable for integrating large capacity memories.

Figure 2:
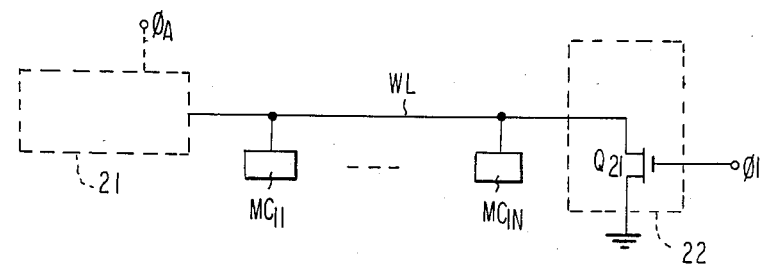

FIG. 2 shows another example of the conventional circuits.

The word line noise prevention circuit 22 is connected to the word line WL which is driven by the decoder 21. After selection or non-selection is decided in the same way as in the circuit shown in FIG. 1, the control signal $\phi_A$ becomes the "1" level and raises the word line to the "1" level when the word line is selected. On the other hand, a signal $\phi_1$ applied to the noise prevention circuit 22 provides a potential a little bit higher than the threshold voltage ($V_T$) of the transistor at least while the control signal $\phi_A$ is at the "1" level, so that the transistor $Q_{21}$ is slightly turned on. This makes it possible to discharge the noise, that has occurred in the non-selected word lines, by the transistor $Q_{12}$ without greatly reducing the "1" level of the selected word line.

Recently, however, attempts have frequently been made to raises the word line potential to a level higher than the power source potential, that is, to raise the control signal $\phi_A$ to a level higher than the power source level, in order to store a large signal in a memory cell such as in a dynamic memory using a single 5V power source. To obtain a level higher than the power source, a method has been used which raises the signal to a high level, then brings the signal into the floating state and obtains a higher potential by means of capacitance coupling. In this case, if the transistor $Q_{21}$ is slightly turned on, the potential of the selected word line is under the floating state of the high level and therefore the higher voltage at the selected word line is decreased in level through the transistor $Q_{21}$. Accordingly, the noise prevention circuit 22 of FIG. 2 is not employable.

Figure 3:
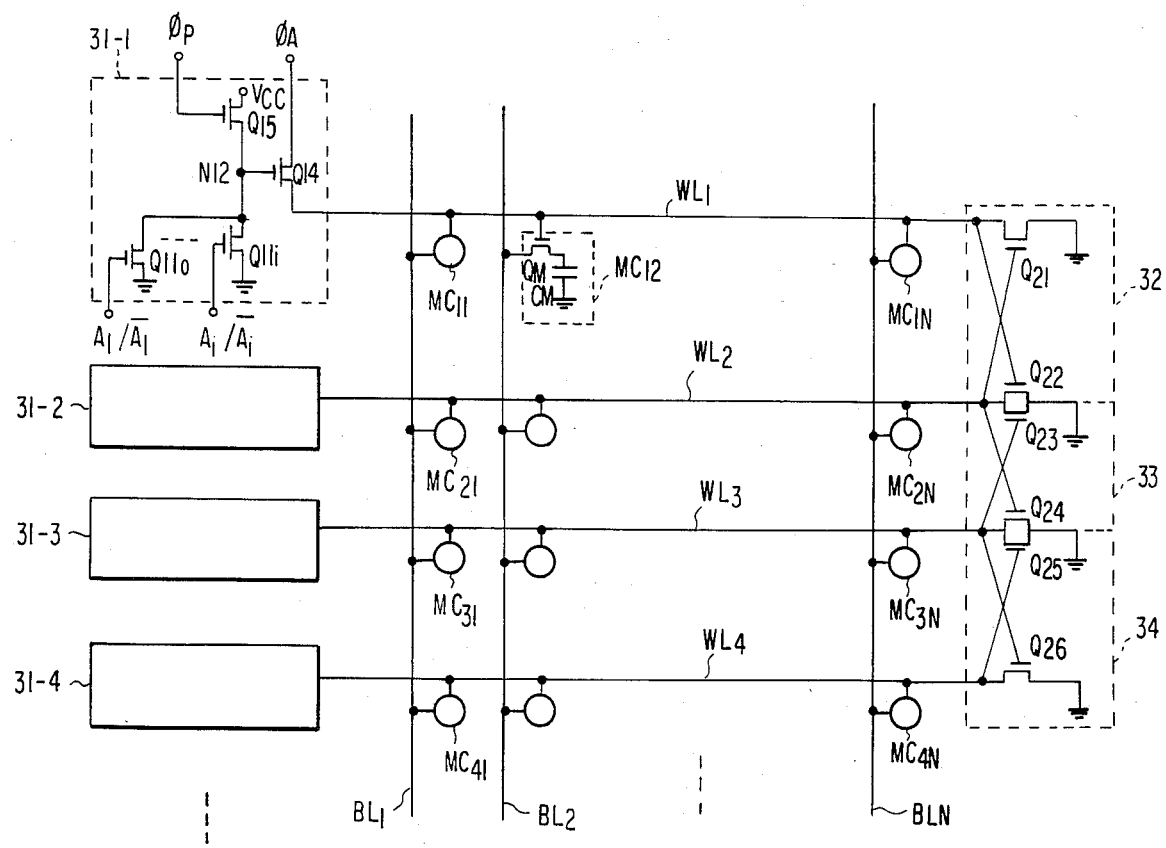
FIG. 3 is a circuit shows a first embodiment of the present invention.

A first embodiment of the present invention will be described with reference to FIG. 3.

The word lines $WL_1 \ldots WL_4 \ldots$, are arranged in parallel with one another in the row direction. A plurality of bit lines $BL_1$ through $BL_N$ are disposed in the column direction crossing at right angles the word lines. Decoder circuits 31-1 ... 31-4 ... are connected to the word lines $WL_1 \ldots WL_4 \ldots$, respectively. Each of the word lines serves as a driving line for the memory cells coupled thereto when it is supplied with a driving signal by the corresponding one of the decoders in a known way. Each of the decoders serves as a driving circuit for the word line when it is selected by address signals applied thereto. As typified by the decoder circut 31-1, each decoder circuit comprises a NOR gate consisting of a transitor $Q_{15}$ which is controlled by a pre-charge signal $\phi_p$ and transistors $Q_{110}$ through $Q_{11i}$ which receive at their gates true and complementary address input signals $A_i/A_1$ through $A_i/\overline{A_i}$ in predetermined combinations, and a driver transistor $Q_{14}$ which receives a control signal $\phi_A$ at its drain, whose gate is connected to a node $N_{12}$, which is the output of the NOR gate, and whose source is connected to the word line $WL_1$ to drive it when selected. Memory cells $MC_{11}$ through $MC_{4N}$ are arranged at the intersections between the word lines and the bit lines. As typified by the memory cell $MC_{12}$, each memory cell consists of a storing capacitor $C_M$ and a transistor $Q_M$ whose source or drain is connected to the bit line $BL_2$ and whose drain or source is connected to the storing capacitor $C_M$.

In the present invention, each noise prevention circuit 32, 33, 34 ... is disposed for each combination of two adjacent word lines, as shown in the drawing. For example, the noise prevention circuit 32 is disposed for the word lines WL1 and WL2. The noise prevention circuit 32 consists of a transistor $Q_{21}$ which is connected between the word line WL1 and the ground and whose gate is connected to the word line WL2 and a transistor $Q_{22}$ which is connected between the word line WL2 and the ground and whose gate is connected to the word line WL1. Similarly, the noise prevention circuits 33 and 34 connected to the word lines WL3 and WL4 consist of transistors $Q_{23}$ and $Q_{24}$ and transistors $Q_{25}$ and $Q_{26}$, respectively.

In a memory circuit, the number of word lines that are selected is always one. In other words, two adjacent word lines WL1 and WL2 are not simultaneously selected. Hence, there are two kinds of state with respect to the two adjacent word lines, that is, the state in which both word lines are in the non-selection state and the state in which one of them is in the selection state with the other being in the non-selection state. If both are in the non-selection state, they do not apply noise to each other. When one of them, or the word line WL1, for example, is selected and reaches the high level, the transistor $Q_{22}$ is turned on and the connection level is applied to the non-selected word line WL2, so that the non-selected word line WL2 can hold the "0" level even if capacitance coupling exists between them.

According to the above embodiment, the noise prevention circuit for each word line can be structured by only two transistors and any wiring for supplying a control signal such as the precharge signal $\phi_p$ is not necessary. Therefore, the noise prevention circuits do not limit the high-density layout of the memory cells. Furthermore, the noise prevention circuit does not affect the selected word line and the selected level of the selected word line can be maintained at or desired value.

Figure 4:
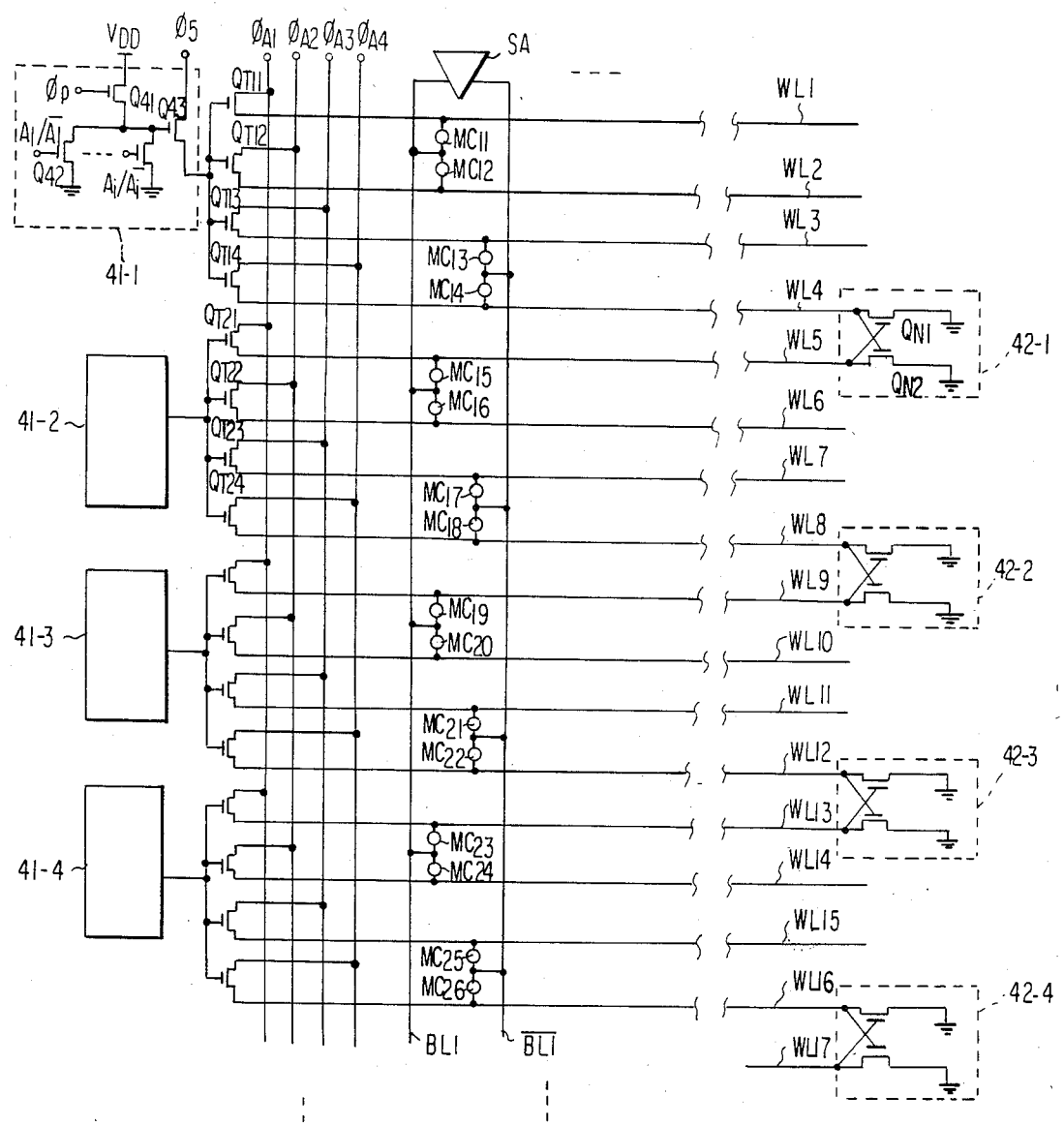
FIG. 4 is a circuit diagram showing a second embodiment of the present invention.

Another embodiment of the present invention will be described with reference to FIG. 4.

Word lines WL1 . . . , WL17 . . . are arranged in parallel with one another in the row direction and a plurality pairs of bit lines (BL1, $\overline{BL1}$) . . . are arranged in the column direction. A sense amplifier SA is connected to the bit line pair. A one-transistor type memory cells $MC_{11} \ldots MC_{26} \ldots$ are disposed at intersections of the word lines and the bit lines. In this arrangement, every two adjacent memory cells coupled to the adjacent word lines are connected to the same bit line. Namely, a memory cell $MC_{11}$ coupled to a word line $WL_1$ and a memory cell $MC_{12}$ coupled to a word line $WL_2$ are connected to the bit line $BL_1$, while a memory cell $MC_1$ coupled to a word line $WL_3$ and a memory cell $MC_{14}$ coupled to a word line $WL_4$ are connected to the bit line $\overline{BL1}$. Similarly, memory cells $MC_{15}$ and $MC_{16}$ are connected to the bit line $BL_1$ and memory cells $MC_{17}$ and $MC_{18}$ are connected to the bit line $\overline{BL1}$.

Arrangements of memory cells with respect to other pairs of bit lines (not shown) are the same as that in the pair of bit lines BL1 and $\overline{BL1}$. According to this arrangement of the memory cells, since every two adjacent memory cells are connected to the same bit line and the same contact hole can be used for connecting the two memory cells to the bit line, the number of contact holes for connecting the memory cells to the bit lines can be reduced half. Therefore, this memory cell arrangement is suitable for a high-density memory circuit.

Decoders 41-1 . . . , 41-4 . . . are disposed in common for four word lines WL1-WL4, WL5-WL8, WL9-WL12, WL13-WL16, . . . respectively. The decoder 41-1, for example, selects the group of word line WL1-WL4. The output of the decoder 41-1 is connected to the gates of four selection transistors $Q_{T11}$ through $Q_{T14}$. The selection transistors $Q_{T11}$ through $Q_{T14}$ are connected between the word lines WL1-WL4 and selection signal $\phi_{A1}-\phi_{A4}$, respectively. The selection signals $\phi_{A1}$ to $\phi_{A4}$ are generated as decoded outputs of two bits of address signals. In the active period in which read or write is effected, only one of the selection signal terminal $\phi_{A1}$ through $\phi_{A4}$ reaches a selection ($V_{DD}$) level on the basis of a two-bit address input and the other three are in the non-selection (ground) level. In this embodiment, a noise prevention circuit is disposed for word lines that are associated to different decoder circuits and are ajacent to each other.

In other words, the noise prevention circuit 42-1 is connected to the word line WL4 which is associated to the decoder 41-1 and to the word line WL5 which is adjacent to the word line WL4 and is connected to the decoder circuit 41-2. The noise prevention circuit 42-1 has a flip-flop structure consisting of transistors $Q_{N1}$ and $Q_{N2}$. Similarly, the noise prevention circuit 42-2 is disposed for the word line WL8 which is associated to the decoder 41-2 and for the word line WL9 which is adjacent to the word line WL8 and is associated to the decoder 41-3. The noise prevention circuits 42-3 and 42-4 are likewise disposed for the word lines WL12 and WL13 and for the word lines WL16 and WL17, respectively.

Since the four word lines, (e.g. WL1 to WL4) that are associated to the selected decoder (e.g. 41-1), are not affected by the noise because they are connected either to the power source ($V_{DD}$) or to the ground via the selection transistors (e.g. $Q_{T11}$ to $Q_{T14}$) that becomes conductive. When the decoder 41-1 is selected, for example, all the transistors $Q_{T11}$ through $Q_{T14}$ become conductive and one of the word lines WL1 through WL4 is set to the $V_{DD}$ level while the other three are set to the ground level in accordance with the voltages of the selection signals $\phi_{A1}$ through $\phi_{A4}$. Hence, the word lines WL1 to WL4 are not affected by the noise. On the other hand, the word lines WL5 through WL16 that are associated to the other decoders 41-2 through 41-4 are in the floating state because the selection transistors $Q_{T21} \ldots$ associated to them are non-conductive. Among the word lines that are associated to these non-selected decoders, however, the word line or lines that are affected by the noise are those adjacent to the selected word line by the selected decoder. In other words, main cause of the noise applied to the word lines is a level change from the non-selection level to the selection level of the selected word line and such a level change is capacitively coupled to the word lines near the selected word line as noise. For this reason, this embodiment disposes the noise prevention circuits for those word lines which are made to correspond to the different decoders and are ajacent to each other.

It will be first assumed that the decoder 41-1 is selected. Then, the transistors $Q_{T11}$ through $Q_{T14}$ are turned on and one of the selection signals $\phi_{A1}$ through $\phi_{A4}$, such as the selection signal $\phi_{A3}$, for example, reaches the "1" level. However, even if the capacitance coupling exists between the word lines WL3 and WL2 or between WL3 and WL4, the noise applied to each word line is discharged by selection signals $\phi_{A2}$ and $\phi_{A3}$ which are ground level because each selection transistor $Q_{T12}-Q_{T14}$ is turned on. Hence, no noise occurs against the word lines WL1-WL4 associated to the selected decoder 41-1. When $\phi_{A4}$ is at the "1" level, the word line WL4 is selected but since the decoder 41-2 is not selected, the transistor $Q_{T21}$ is turned off and the word line WL5 receives the noise from the selected word line WL4. However, the transistor $Q_{N2}$ in the noise prevention circuit 42-1 is turned on so that it can erase the noise of the word line WL5. Since the transistor $Q_{N1}$ is turned off, adverse influences are not exterted upon the word line WL4.

According to this embodiment, each noise prevention circuit is provided for a plurality of word lines associated to one of decoders and hence the number of the noise prevention circuits can be remarkably reduced.

The present invention has been explained by way of examples, but the present invention does not limited to the explained examples.

I claim:

1. A memory circuit comprising first and second word lines adjacently arranged in parallel, a first driving means coupled to said first word line, a second driving means coupled to said second word line, a plurality of bit lines intersecting with said first and second word lines, a plurality of memory cells coupled between said word lines and said bit lines, and a noise preventing circuit coupled to said first and second word lines, said noise preventing circuit including a first field effect transistor coupled between said first word line and a reference voltage, means for connecting a gate of said first transistor to said second word line, a second field effect transistor coupled between said second word line and said reference voltage, and means for connecting a gate of said second transistor to said first word line.

2. The memory circuit according to claim 1, in which each of said first and second, driving means includes means for precharging a first node, a plurality of decoding field effect transistors coupled between said first node and said reference voltage in parallel, each of said decoding field effect transistors receiving an address signal at its gate, an output field effect transistor, means for connecting a gate of said output field effect transistor to said first node, means for connecting one of a drain and a source of said output field effect transistor to associated one of said word lines, and means for supplying the other of the drain and source of said output field effect transistor with a control signal.

3. The memory circuit according to claim 1, in which each of said memory cells includes a capacitor and a transfer field effect transistor coupled between said capacitor and associated one of said bit line and having a gate coupled to associated one of said word lines.

4. The memory circuit according to claim 1, in which said noise preventing circuit is coupled to one ends of said first and second word lines with the other ends being coupled to said first and second decoders, respectively.

5. A memory circuit comprising first and second word line groups each including a plurality of word lines arranged in parallel, a plurality of bit lines intersecting with said word lines, a plurality of memory cells each coupled to one of said word lines and one of said bit lines, first and second decoders provided for said first and second word line groups, respectively, a first selection circuit coupled between said first decoder and the word lines of said first word line group, said first selection circuit selecting one of word lines of said first word line group when an output of said first decoder is selected, a second selection circuit coupled between said second decoder and the word lines of said second word line group, said second selection circuit selecting one of word lines of said second word line group when an output of said second decoder is selected, and a cross-coupled circuit connected to adjacent two word lines of said first and second word lines groups one by one, said cross-coupled circuit including a first field effect transistor coupled between one of said adjacent two word lines and a reference voltage, means for connecting a gate of said first transistor to the other of said adjacent two word lines, a second field effect transistor coupled between the other of said adjacent two word lines and said reference voltage, and means for connecting a gate of said second transistor to said one of said adjacent two word lines.

6. The memory circuit according to claim 5, in which each of decoders is of a dynamic type.

7. The memory circuit according to claim 5, in which each of said selection circuits includes a plurality of control terminals of the same number as that of the word lines of said word line group, a plurality of selection field effect transistors each coupled between associated one of said control terminals and associated one of the word lines of the associated word line group, and means for connecting gates of said selection transistors to the output of the associated decoder.

8. The memory circuit according to claim 5, in which said memory cells are arranged in such a manner that every two memory cells connected to adjacent two word lines are connected to the same bit line.

9. A memory circuit comprising at least two word lines adjacently arranged in parallel, a plurality of bit lines intersecting with said word lines, a plurality of memory cells, each of said memory cells being coupled to one of said word lines and one of said bit lines, selecting means for selecting one of said word lines in response to address signals, and a noise preventing circuit coupled to said two adjacent word lines, said noise preventing circuit maintaining a potential at one of said two adjacent word lines at a referecne voltage when the other of said two adjacent word lines is selected by said selecting means.

10. A transistor circuit comprising first and second drive line, driving means coupled to said first and second drive lines for selectively driving one of said first and second drive lines in response to at least one input signal applied to said driving means, a first transistor having a gate connected to said first drive line, a second transistor having a gate connected to said second drive line, and a noise preventing circuit coupled to said first and second drive lines, said noise preventing circuit including a third transistor coupled between said first drive line and a reference voltage terminal with its drain-source current path, a fourth transistor coupled between said second drive line and said reference voltage terminal, means for connecting a gate of said third transistor to said second drive line and means for connecting a gate of said fourth transistor to said first drive line.

11. The circuit according to claim 10, in which said first and second drive lines are arranged in parallel.

* * * * *

UNITED STATES PATENT AND TRADEMARK OFFICE
CERTIFICATE OF CORRECTION

PATENT NO. : 4,602,355
DATED : July 22, 1986
INVENTOR(S) : Hiroshi Watanabe

It is certified that error appears in the above-identified patent and that said Letters Patent is hereby corrected as shown below:

Column 1, line 30, delete "celected" and insert --selected--

Column 2, line 5, delete "prevent" and insert --present--

Column 3, line 1, delete "A0/$\overline{A0}$" and insert --A0/$\overline{A}$0--

Column 3, line 2, delete "Ai/$\overline{Ai}$" and insert --Ai/$\overline{A}$i--

Column 3, line 14 after "transistor" delete "in"

Column 3, line 21, after "1" delete ","

Column 4, line 33 reads "Ai/A$_1$" should read --Ai/$\overline{A}_1$--

Column 4, line 44, delete "tothe" and insert --to the--

Column 6, line 64, delete "I claim:" and insert --In the claims:--

Signed and Sealed this

Seventeenth Day of March, 1987

Attest:

DONALD J. QUIGG

Attesting Officer

Commissioner of Patents and Trademarks